(12) United States Patent
Das et al.

(10) Patent No.: US 10,181,350 B2
(45) Date of Patent: *Jan. 15, 2019

(54) SELECTIVE WRITES IN A STORAGE ELEMENT

(71) Applicant: ARM Limited, Cambridge (GB)

(72) Inventors: Shidhartha Das, Upper Cambourne (GB); Andreas Hansson, Cambridge (GB); Akshay Kumar, New Delhi (IN); Piyush Agarwal, Noida (IN); Azeez Jennudin Bhavnagarwala, Newtown, CT (US); Lucian Shifren, San Jose, CA (US)

(73) Assignee: Arm Limited, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/842,207

(22) Filed: Dec. 14, 2017

(65) Prior Publication Data

US 2018/0114575 A1 Apr. 26, 2018

Related U.S. Application Data

(63) Continuation of application No. 15/334,747, filed on Oct. 26, 2016, now Pat. No. 9,859,003.

(51) Int. Cl.
  *G11C 11/00* (2006.01)
  *G11C 13/00* (2006.01)

(52) U.S. Cl.
  CPC ...... *G11C 13/0069* (2013.01); *G11C 13/0002* (2013.01); *G11C 13/004* (2013.01); *G11C 13/0007* (2013.01); *G11C 13/0064* (2013.01); *G11C 2013/0045* (2013.01); *G11C 2013/0054* (2013.01); *G11C 2013/0076* (2013.01); *G11C 2013/0078* (2013.01); *G11C 2207/2263* (2013.01); *G11C 2213/31* (2013.01)

(58) Field of Classification Search
  CPC ............ G11C 13/0069; G11C 13/0007; G11C 13/004; G11C 13/0064; G11C 2013/0076; G11C 2213/31; G11C 2013/0054
  See application file for complete search history.

(56) References Cited

U.S. PATENT DOCUMENTS

| | | | |
|---|---|---|---|
| 7,864,588 B2 * | 1/2011 | Betser | G11C 16/0475 365/185.2 |
| 7,924,628 B2 * | 4/2011 | Danon | G11C 11/5628 365/185.22 |
| 9,859,003 B1 * | 1/2018 | Das | G11C 13/0069 |
| 2008/0106925 A1 | 5/2008 | Paz de Araujo et al. | |
| 2009/0040813 A1 | 2/2009 | Kang et al. | |
| 2014/0269043 A1 | 9/2014 | Chu | |
| 2015/0302925 A1 | 10/2015 | Oh et al. | |

* cited by examiner

*Primary Examiner* — Pho M Luu
(74) *Attorney, Agent, or Firm* — Leveque IP Law, P.C.

(57) ABSTRACT

A method of writing a state to a correlated electron element in a storage circuit, comprising receiving a write command to write the state into the correlated electron element; reading a stored state of the correlated electron element; comparing the state and the stored state; and enabling a write driver to write the state into the correlated electron element when the state and read state are different.

14 Claims, 6 Drawing Sheets

SELECTIVE WRITES IN A STORAGE ELEMENT

PRIORITY CLAIM

This application is a continuation of U.S. patent application Ser. No. 15/334,747 filed on Oct. 26, 2016, now U.S. Pat. No. 9,859,003, which is hereby incorporated herein by reference in its entirety.

FIELD OF THE DISCLOSURE

The present techniques relate to selective writes in a storage element. More particularly, the present techniques apply to storage elements, such as memory elements, comprising a correlated electron material. Furthermore, the techniques relate to circuits and devices incorporating such memory elements and methods of operation and manufacture thereof.

BACKGROUND

Non-volatile memory is a class of memory in which the memory cell or element does not lose its memory state after power supplied to the element is removed, and includes electrically erasable programmable read-only memory (EEPROM), flash memory, ferroelectric RAM (FeRAM), magnetic RAM (MRAM) to name but a few.

In flash memory, an ability to keep random access (erase/write single bits) was sacrificed for speed and higher bit density in comparison to EEPROMs. Flash memory remains a non-volatile memory of choice. Nevertheless, it is generally recognized that flash memory technology may not scale easily below 40 nanometers (nm).

Technologies considered for the replacement of, or for use in parallel with, flash memory have included resistance-based memory which is based on certain materials that exhibit a resistance change associated with a change of phase of the material (determined by the long range ordering of the atoms in the crystalline structure).

In one type of such resistance-based memory, called a phase change memory (PCM/PCRAM), a change in resistance occurs as the material of the memory element is melted briefly and then cooled to either a conductive crystalline state or an insulative amorphous state. However, resistance-based memories have not proved to be commercially useful because their transition between the conductive and the insulative states depends on a physical structure phenomenon, e.g. in a process of melting at up to 600° C. and returning to a solid state, whereby the process cannot be sufficiently controlled to be used as a reliable memory, and therefore is unsuitable for many applications.

Another resistance-based memory includes memory elements consisting of materials that respond to an initial high "forming" voltage and current to activate a variable resistance function. For example, the operation of resistive RAMs (ReRAMs) or conductive bridge RAMS (CBRAM) may be strongly temperature dependent, such that a resistive switching mechanism in a ReRAM/CBRAM may also be strongly temperature dependent. Certain types of ReRAM may also exhibit unstable qualities. Further, resistance switching in ReRAM/CBRAMs tends to fatigue over many memory cycles.

DETAILED DESCRIPTION

Broadly speaking, embodiments of the present techniques incorporate a Correlated Electron Material (CEM) to form a correlated electron switch (CES) element. In this context, a CES element may exhibit an abrupt conductor/insulator transition from a conductive state (a low impedance and low capacitance state) to an insulative (high impedance and high capacitance state) state, or vice versa, arising from electron correlations in the CEM rather than solid state structural phase changes (e.g., crystalline/amorphous changes as occurs in phase change memory (PCM) devices or filamentary formation as occurs in resistive RAM devices as briefly discussed above).

In operation, the endurance of a memory cell comprising a CEM element depends on various factors including the voltage across the CEM element terminals and the current through the CEM element. Typically, the lower the voltage, the higher the endurance of the CEM element and the lower the current, the higher the endurance of the CEM element.

Initiating read and write operation cycles of the memory cell requires application of a voltage across the terminals, which in turn allows current to flow. The endurance or lifetime of a non-volatile memory element such as one fabricated from a CEM can be therefore be measured by the number of times a read or write operation can be performed on it. Since the voltage across a CEM and the current differs for a read and write operation, the number of cycles before a CEM breaks down is not the same for both operations. A CEM can be read at a very low voltage such as 0.2V compared to a write operation, which may occur at a voltage of around 1.2V. So the number of times a CEM can be read before degradation far exceeds the number of write cycles before breakdown.

Techniques disclosed herein describe a circuit and a method for endurance or lifetime improvements in storage elements, such as memory elements, comprising a correlated electron material. Write access cycles to individual bit-cells are reduced by performing an initial read access and comparing read-data with the data to be written. A subsequent write access is performed only in the event that data to be written is different from the read data.

Techniques disclosed herein are particularly beneficial for the design and operation of hard memory disks.

According to a first technique, there is provided a method of writing a state to a correlated electron element in a storage circuit, the method comprising receiving a write command for writing the state into the correlated electron element; reading a stored state of the correlated electron element; comparing the state and the stored state; and enabling a write driver for writing the state into the correlated electron element when the state and read state are different.

In embodiments, enabling the write driver includes resetting from a high impedance state to a low impedance state or setting from a low impedance state to a high impedance state. In embodiments the reading of the stored state is read on a bitline coupled across a sense amplifier and the correlated electron element.

Techniques provide for the bitline to be pulled down to a reference voltage when the state and the read state are the same or for the bitline to be pulled up to a reference voltage when the state and read state are different.

In embodiments reading may occur in a read-pulse where write is inactive and writing may occur in a write-pulse where reading is not active. The read and the write pulse may be done in separate clock cycles or in a single clock cycle. In such an embodiment, the clock may be a timing pulse to make a pulsed read.

In embodiments, in the event of the stored state and read state being matching states, the method includes not writing the state to be written into the correlated electron element.

Not writing the state to be written into the correlated electron element may occur in a second clock cycle, following a first clock cycle comprising reading the stored state.

In embodiments, the state of the correlated electron element is controllable by the write driver to be in one of a high impedance state and a low impedance state.

According to a second technique, there is provided a storage circuit comprising an array of correlated electron elements provided with first signal lines coupled to each correlated electron element and a sensor circuit capable of sensing a state of a correlated electron element; a comparator circuit coupled to the sensor circuit for receiving the sensed state and for receiving a state to be written into a correlated electron element; wherein the comparator circuit comprises first output terminals coupled to a logic circuit having second output terminals coupled to the first signal line.

In embodiments, the first signal line may be a multiplexed bit line. In embodiments, the comparator is capable of outputting a data signal indicative of when the sensed state and received state are the same and when the sensed state and received state are different.

In embodiments, the comparator circuit is capable of outputting a voltage for setting a state of the correlated electron element from a low impedance state to a high impedance state and resetting a state from a high impedance state to a low impedance state.

Further techniques and embodiments will now be described with reference to the accompanying figures of which.

A "state" or "memory state" of the CES element may be dependent on the impedance state or conductive state of the CES element. In this context, the "state" or "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative states. As discussed in the particular example implementations below, material of a CES element sandwiched between conductive terminals may be placed in an insulative state by application of a first programming signal across the terminals having a voltage $V_{reset}$ and current $I_{reset}$ at a current density $J_{reset}$, or placed in a conductive state by application of a second programming signal across the terminals having a voltage $V_{set}$ and current $I_{set}$ at current density $J_{set}$.

Additionally or alternatively, a CES element may be provided as a memory cell in a cross-point memory array whereby the CES element may comprise a metal/CEM/metal (M/CEM/M) stack formed on a semiconductor. Such an M/CEM/M stack may be formed on a diode, for example. In example implementations, such a diode may be selected from the group consisting of a junction diode and a Schottky diode. In this context, it should be understood that "metal" means a conductor, that is, any material that acts like a metal, including, for example, polysilicon or a doped semiconductor.

Figure 1A:
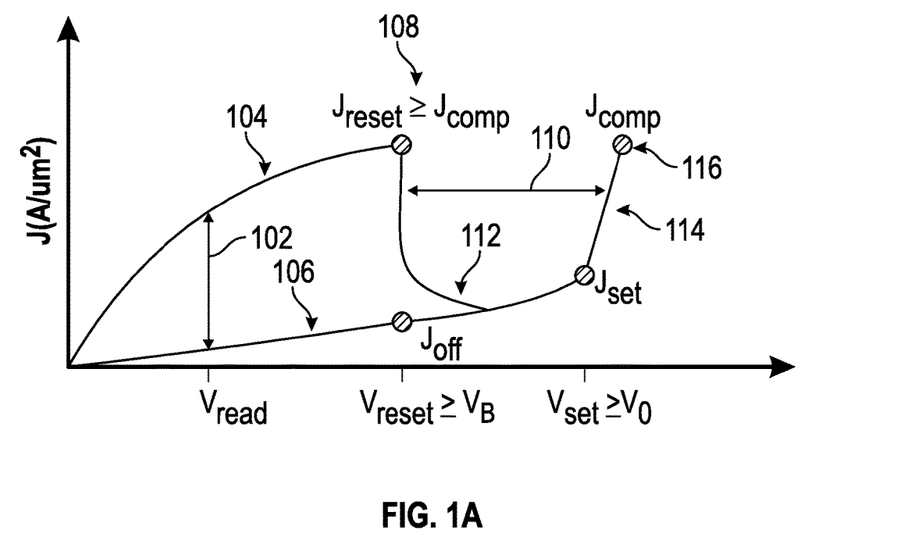
FIG. 1a shows a plot of current density versus voltage for a CES element according to an embodiment.

FIG. 1a shows a plot of current density versus voltage across terminals (not shown) for a CES element. Based, at least in part, on a voltage applied to terminals of the CES element (e.g., in a write operation), the CES may be placed in a conductive state or an insulative state. For example, application of a voltage $V_{set}$ and current density $J_{set}$ may place the CES element in a conductive memory state and application of a voltage $V_{reset}$ and a current density $J_{reset}$ may place the CES element in an insulative memory state.

Following placement of the CES in an insulative state or conductive state, the particular state of the CES element may be detected by application of a voltage $V_{read}$ (e.g., in a read operation) and detection of, for example, a current or current density at terminals or bias across the terminals of the CES element.

Both the current and the voltage of the CES element need to be controlled in order to switch the CES element state. For example, if the CES element is in a conductive state, and voltage $V_{reset}$ required to place the device in an insulative memory state, is applied thereto, the CES element will not switch into the insulative state until the current density is also at the required value of $J_{reset}$. This means that, when the CES element is used to read/write from a memory, unintended rewrites may be prevented since even if sufficient voltage is applied to the CES element, a memory state change will only occur if the required current density is also applied.

The CES element of FIG. 1a may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES element may be prepared without electroforming. Other implementations may employ other transition metal compounds without deviating from claimed subject matter. For example, {M(chxn)2Br}Br2 where M may comprise Pt, Pd, or Ni, and chxn comprises 1R,2R-cyclohexanediamine, and other such metal complexes may be used without deviating from claimed subject matter.

When sufficient bias is applied (e.g., exceeding a band-splitting potential) and the aforementioned Mott condition is met (injected electron holes=the electrons in a switching region), the CES element may rapidly switch from a conductive state to an insulative state via the Mott transition. This may occur at point 108 of the plot in FIG. 1a. At this point, electrons are no longer screened and become localized. This correlation may result in a strong electron-electron interaction potential which splits the bands to form an insulator. While the CES element is still in the insulative state, current may be generated by transportation of electron holes. When sufficient bias is applied across terminals of the CES, electrons may be injected into a metal-insulator-metal (MIM) diode over the potential barrier of the MIM device. When sufficient electrons have been injected and sufficient potential is applied across terminals to place the CES element in a set state, an increase in electrons may screen electrons and remove a localization of electrons, which may collapse the band-splitting potential forming a metal.

Current in a CES element may be controlled by an externally applied "compliance" condition determined based, at least in part, on the external current limited during a write operation to place the CES element in a conductive state. This externally applied compliance current may also set a condition of a current density for a subsequent reset operation to place the CES in an insulative state.

As shown in the particular implementation of FIG. 1a, a current density $J_{comp}$ applied during a write operation at point 116 to place the CES element in a conductive state may determine a compliance condition for placing the CES element in an insulative state in a subsequent write operation. For example, the CES element may be subsequently placed in an insulative state by application of a current density $J_{reset} \geq J_{comp}$ at a voltage $V_{reset}$ at point 108, where $J_{comp}$ is externally applied.

The compliance condition therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p.

A current or current density in a region 104 of the plot shown in FIG. 1 may exist in response to injection of holes from a voltage signal applied across terminals of a CES element. Here, injection of holes may meet a Mott transition criterion for the conductive state to insulative state transition as a critical voltage is applied across terminals of CES element.

A "read window" 102 for detecting a memory state of a CES element in a read operation may be set out as a difference between a portion 106 of the plot of FIG. 1 while the CES element is in an insulative state, and a portion 104 of the plot of FIG. 1 while the CES element is in a conductive state at a read voltage $V_{read}$.

Similarly, a "write window" 110 for placing a CES element in an insulative or conductive memory state in a write operation may be set out as a difference between $V_{reset}$(at $J_{reset}$ and $V_{set}$ (at $J_{set}$). Establishing $|V_{set}|>|V_{reset}|$ enables a switch between conductive and insulative states. $V_{reset}$ may be approximately at a band splitting potential arising from correlation and $V_{set}$ may be approximately twice the band splitting potential. In particular implementations, a size of write window 110 may be determined, at least in part, by materials and doping of the CES element. The transition from high resistance (or high capacitance) to low resistance (or low capacitance) can be represented by a singular impedance of the device. "Write window" 110 may be set out as a difference between a portion 112 of the plot and a portion 114 of the plot, as shown.

Figure 1B:
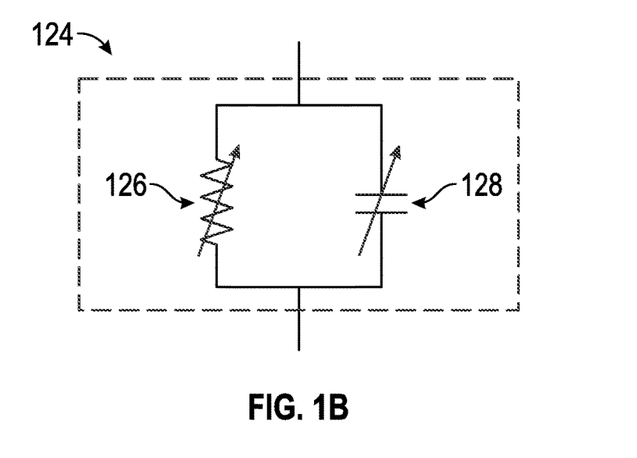
FIG. 1b is a schematic diagram of an equivalent circuit to a CES element according to an embodiment.

FIG. 1b depicts a schematic diagram of an equivalent circuit of an example variable impeder device (such as a CES element), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Although the variable resistor 126 and variable capacitor 128 are depicted in FIG. 1b as discrete components, variable impeder device 124 may equally comprise a substantially homogenous CES element, wherein the CES element comprises characteristics of variable capacitance and variable resistance. Table 1 below depicts an example truth table for an example variable impedance device, such as variable impeder device 124.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

In operation, a CES element is set to store a 1 and reset to store a 0. Whether the CES element is set or reset when writing a state into the CES element depends of course on whether the original stored state is a 1 or 0. The endurance of a CES element can be measured by the number of times a read, reset or set operation can be performed on it. But since the voltage across the CES element and the current through it differs for a read, reset or set operation, the number of cycles before a CES element breaks down is not the same for all three operations. Since a CES element can be read at a very low voltage (such as 0.2V) and at a very low value of read current (as low as 2 uA) as compared to that of a program operation, the number of times a CES element can be read is much more than the number of times it can be programmed. Similarly, since the voltage requirement for reset is much less than that of a set operation, a CES element can tolerate more reset cycles as compared to the number of set cycles before its breakdown, even though the current requirement for reset operation is more than that of a set operation.

The number of cycles of read, reset and set that a CES element can tolerate before breakdown may be given by:

$N_{read} > N_{reset} > N_{set}$

If the number of program cycles is reduced, then the lifetime of a CES based non-volatile memory array can be increased because the effective program cycles would be lesser than the applied program cycles. In effect, techniques disclosed herein eliminate or at least reduce the number of unwanted program operations by a combination of limiting the number of state changes; reducing the voltage across the CES element and reducing the current flowing through the CES element.

Figure 2:
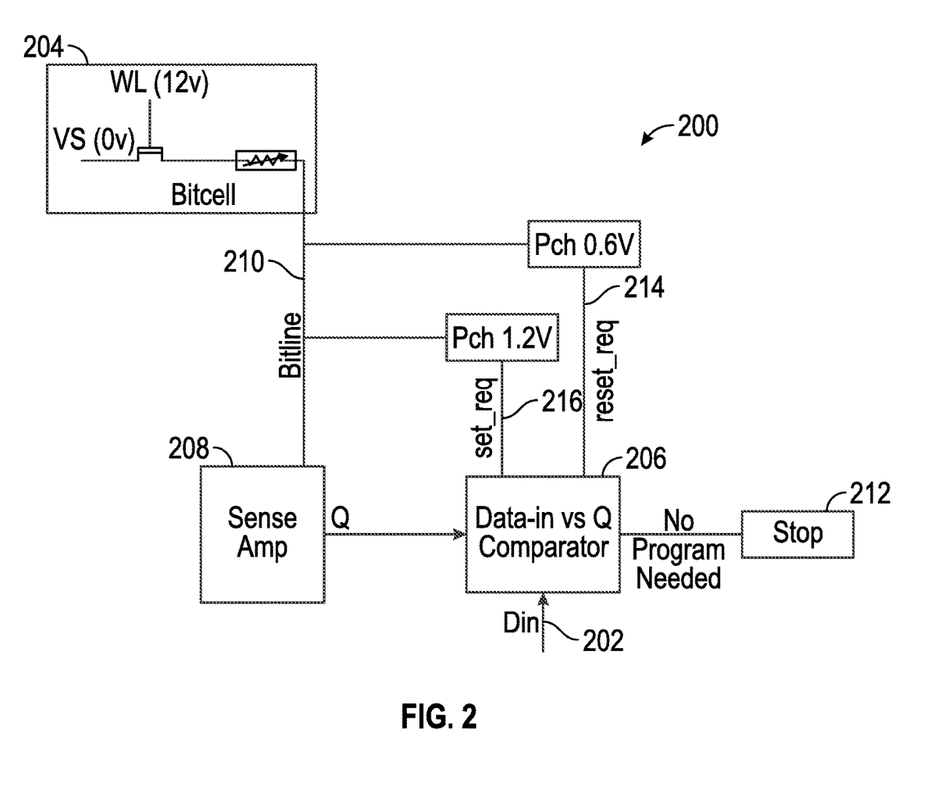
FIG. 2 is a schematic block diagram of a driving scheme according to an embodiment.

Referring to FIG. 2, a schematic block diagram 200 of a driving scheme according to an embodiment illustrates how a sense operation is performed within each program cycle. First input data, $D_{in}$ 202 being a state to be written into a bitcell 204 is fed to a voltage comparator 206 having second input data, Q being a sensed state of the bitcell 204. The sense amplifier 208 and the bitcell 204 communicate through bitline 210 connecting sense amplifier 208 and bitcell 204. The voltage comparator 206 has first output 212 indicating that no program operation is needed, STOP, second output 214 indicating a reset operation, reset_req and third output 216 indicating a set operation, set_req.

In operation of the driving scheme of FIG. 2, the voltage comparator 206 determines if a program operation is required or not according to the below Table 1:

TABLE 1

| Stored Data Q | Input Data $D_{in}$ | Set_req | Reset_req |
|---|---|---|---|
| 0 | 0 | No | No |
| 0 | 1 | Yes | No |
| 1 | 0 | No | Yes |
| 1 | 1 | No | No |

Since a read operation is performed at a very low voltage around 0.2V and at a very low current around 2 μA, the degradation per read cycle is significantly lesser as compared to a reset operation where both the voltage around 0.6V and current 6 μA are considerably higher. For a set operation, the degradation is higher because the applied voltage across a CES element is around 1.2V although the current is around 2 μA.

The degradation for a reset, reset_req and set operation, set_req would also be dependent upon the initial state as shown in Table 2:

TABLE 2

| Initial State | Final State | Operation |
|---|---|---|
| Reset | Reset | The state of a CES element does not change and it conducts low current at around 0.6 V |
| Reset | Set | The CES element changes state from high resistance state to low resistance state and conducts higher current at around 1.2 V |
| Set | Reset | The CES element changes state from low resistance state to high resistance state and conducts higher current at 0.6 V |
| Set | Set | The CES element changes state twice and conducts high current at 0.6 V followed by higher current at 1.2 V |

The degradation for each read, reset and set cycle can be as shown in Table 3:

TABLE 3

| Degradation | Initial State | |
|---|---|---|
| Operation | Reset | Set |
| Read | x | x |
| Reset | 2x | 10x |
| Set | 20x | 30x |

As an example of present techniques, we describe an application of a CES element used as a non-volatile memory in a backup storage unit. In use as a backup storage unit, data may be periodically written into storage disks and backing up the entire disk 4-6 times a day is common practice for such an application. In such a scenario, most of the data being written can be the same as that already on the disk and, as such, prior art methods would involve programming the CES elements to the same state repeatedly. According to present techniques, the life time of such a storage disk can be increased through reduced degradation of the CES element by reducing the number of cycles of read, reset and set.

For the purposes of this example, we will assume a disk having a capacity "x" and during every cycle 90% of the data being written is the same as stored already in the disk. Of the data, 50% is assumed to be a "0" and 50% to be a "1".

Considering the degradation values in Table 3 above, the total degradation for one backup cycle for the prior art compared to techniques according to embodiments described herein is as follows in Table 4:

TABLE 4

| | | Degradation per operation | | Degradation Factor | |
|---|---|---|---|---|---|
| Operation | Occurrence | Standard Scheme | Proposed Scheme | Standard Scheme | Proposed Scheme |
| S»R | 5% | 10x | 11x | 0.5x | 0.55x |
| R»S | 5% | 20x | 21x | 1.0x | 1.05x |
| R»R | 45% | 2x | x | 0.9x | 0.45x |
| S»S | 45% | 30x | x | 13.5x | 0.45x |
| Total Degradation | | | | 15.9x | 2.5x |

Accordingly, the increase in lifetime of a CES element based backup storage unit can be expressed as (15.9x−2.5x)/2.5x, which is an over 5 times increase in lifetime.

Figure 3:
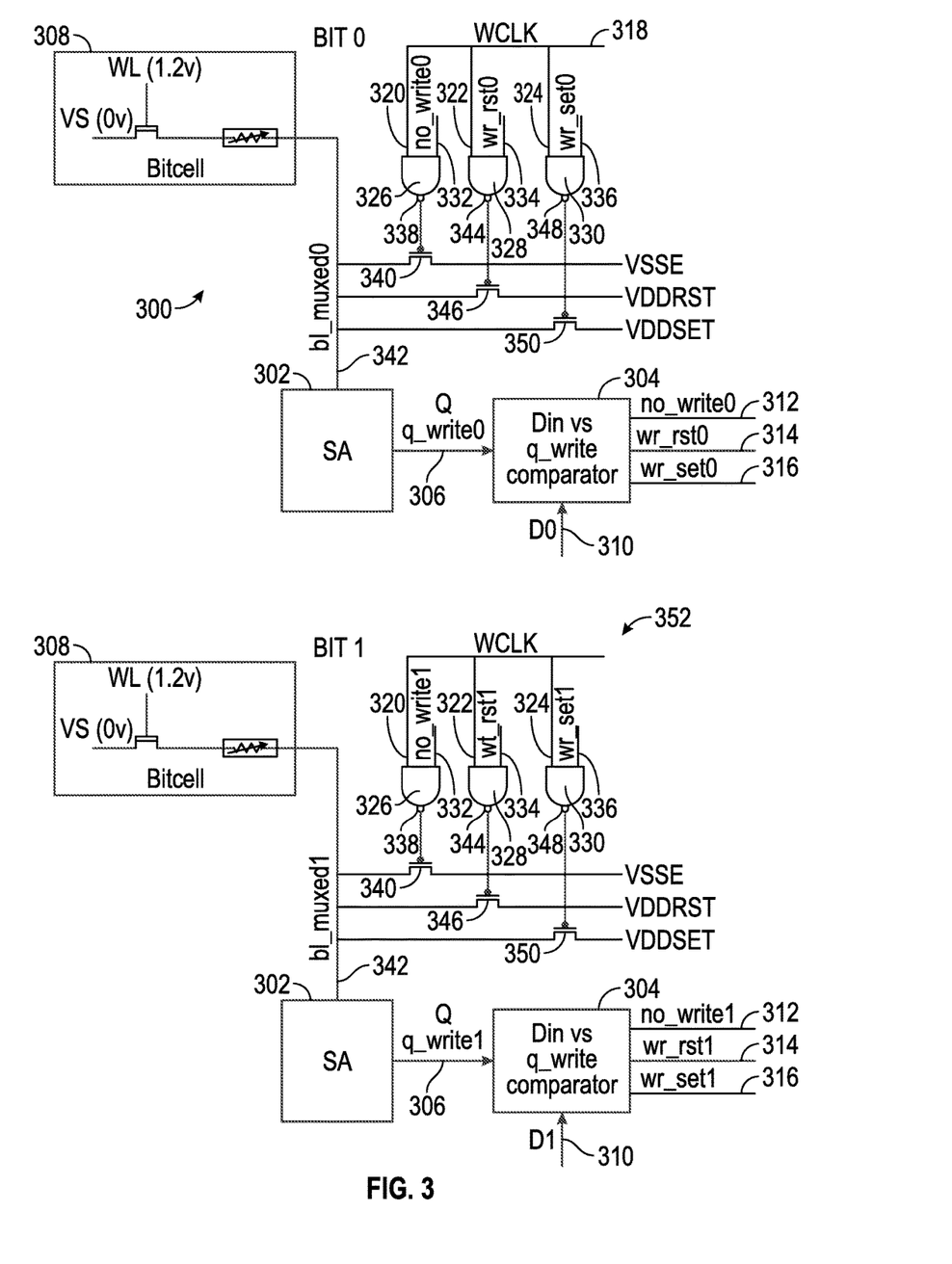
FIG. 3 is a schematic circuit diagram showing two columns of a memory array according to an embodiment.

FIG. 3 is a schematic circuit diagram showing two columns of a memory array according to an embodiment.

Referring to FIG. 3, a first column 300 is represented as holding a logic "BIT 0" in a memory store and comprises a sense amplifier 302 connected to a voltage comparator 304 having first input terminal 306 to receive first input data, q_write0, being a state Q, in this case a logic state 0, of a bitcell 308. The voltage comparator 304 has a second input terminal 310 to receive a state d0 to be written into the bitcell 308. The voltage comparator 304 comprises three output terminals 312, 314 and 316 for output signals no_write0, wr_rst0 and wr_set0 respectively.

Word line 318 shown as WCLK where CLK denotes a clock signal is arranged to receive a pulse generated from the clock signal applied to first input terminals 320, 322 and 324 of three NAND logic gates 326, 328 and 330 respectively. First NAND logic gate 326 comprises second input terminal 332 to receive voltage comparator 304 output signal no_write0, second NAND logic gate 328 comprises second input terminal 334 to receive voltage comparator 304 output signal wr_rst0, and third NAND logic gate 330 comprises second terminal 336 to receive voltage comparator 304 output signal wr_set0.

The first NAND logic gate 326 comprises output terminal 338 connected to a gate terminal of a switch shown schematically as first NMOS transistor 340. First NMOS transistor 340 has a drain terminal connected to voltage source Vsse and source terminal connected to a multiplex bit line bl_muxed0 342. The second NAND logic gate 328 comprises output terminal 344 connected to a gate terminal of a switch shown schematically as a first PMOS transistor 346. First PMOS transistor 346 has a source terminal connected to a voltage source VDDrst and a drain terminal connected to the multiplex bit line bl_muxed0 342. The third NAND logic gate 330 comprises output terminal 348 connected to a gate terminal of a switch shown schematically as a second PMOS transistor 350. Second PMOS transistor 350 has a source terminal connected to a voltage source VDDset and a drain terminal connected to the multiplex bit line bl_muxed 342. The multiplex bit line bl_muxed0 342 is connected the bitcell 308.

Also in FIG. 3, a second column 352 is represented as holding a logic "BIT 1". The second column comprises a sense amplifier 302 connected to a voltage comparator 304 having first input terminal 306 to receive first input data, q_write1, being a state Q, in this case a logic state 1, of a bitcell 308. The voltage comparator 304 has a second input terminal 310 to receive a state d1 to be written into the bitcell 308. The voltage comparator 304 comprises three output terminals 312, 314 and 316 for output signals no_write1, wr_rst1 and wr_set1 respectively.

Word line 318 shown as WCLK where CLK denotes a clock signal is arranged to receive a pulse generated from the clock signal applied to first input terminals 320, 322 and 324 of three NAND logic gates 326, 328 and 330 respectively. First NAND logic gate 326 comprises second input terminal 332 to receive voltage comparator 304 output signal no_write1, second NAND logic gate 328 comprises second input terminal 334 to receive voltage comparator 304 output signal wr_rst1, and third NAND logic gate 330 comprises second terminal 336 to receive voltage comparator 304 output signal wr_set1.

The first NAND logic gate 326 comprises output terminal 338 connected to a gate terminal of a switch shown schematically as first NMOS transistor 340. First NMOS transistor 340 has a drain terminal connected to voltage source Vsse and source terminal connected to a multiplex bit line bl_muxed1 342. The second NAND logic gate 328 comprises output terminal 344 connected to a gate terminal of a switch shown schematically as a first PMOS transistor 346. First PMOS transistor 346 has a source terminal connected to a voltage source VDDrst and a drain terminal connected to the multiplex bit line bl_muxed1 342. The third NAND logic gate 330 comprises output terminal 348 connected to a gate terminal of a switch shown schematically as a second PMOS transistor 350. Second PMOS transistor 350 has a source terminal connected to a voltage source VDDset and a drain terminal connected to the multiplex bit line bl_muxed1 342. The multiplex bit line bl_muxed1 342 is connected the bitcell 308.

In operation of the embodiment described in FIG. 3, the read data q_write0 and q_write1 is compared with the input data d0 and d1 in the voltage comparator 304. The output signal of the voltage comparator 304 is no_write if the input and the read values match. The multiplex bit line 342 is pulled down to Vsse if no write operation is to be performed. If the read value does not match with the input data d0, d1 then the output signal wr_rst or wr_set goes high and the multiplex bit line 342 is charged to either VDDrst or VDDset respectively.

Figure 4:
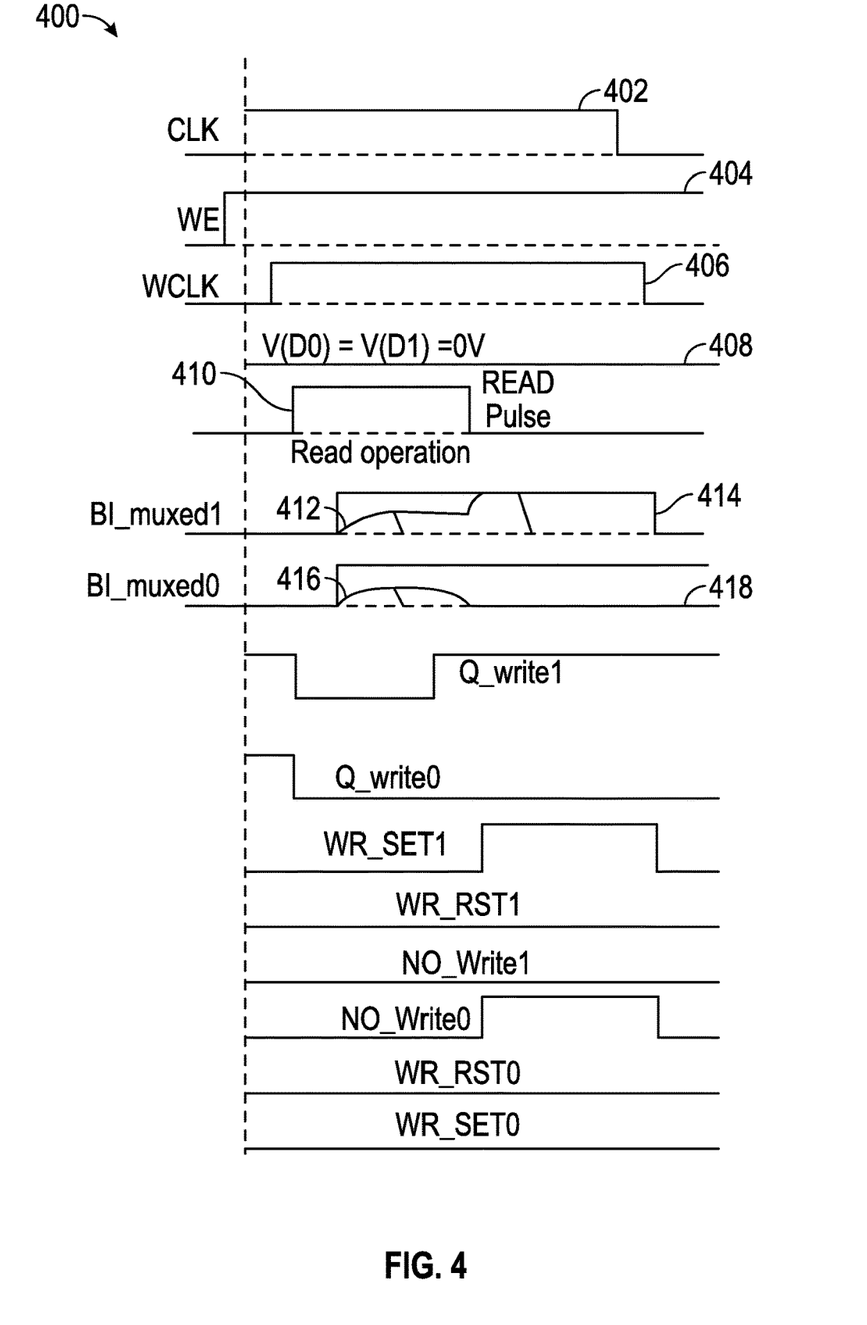
FIG. 4 is a schematic diagram of waveforms in a first write cycle according to an embodiment.
Figure 5:
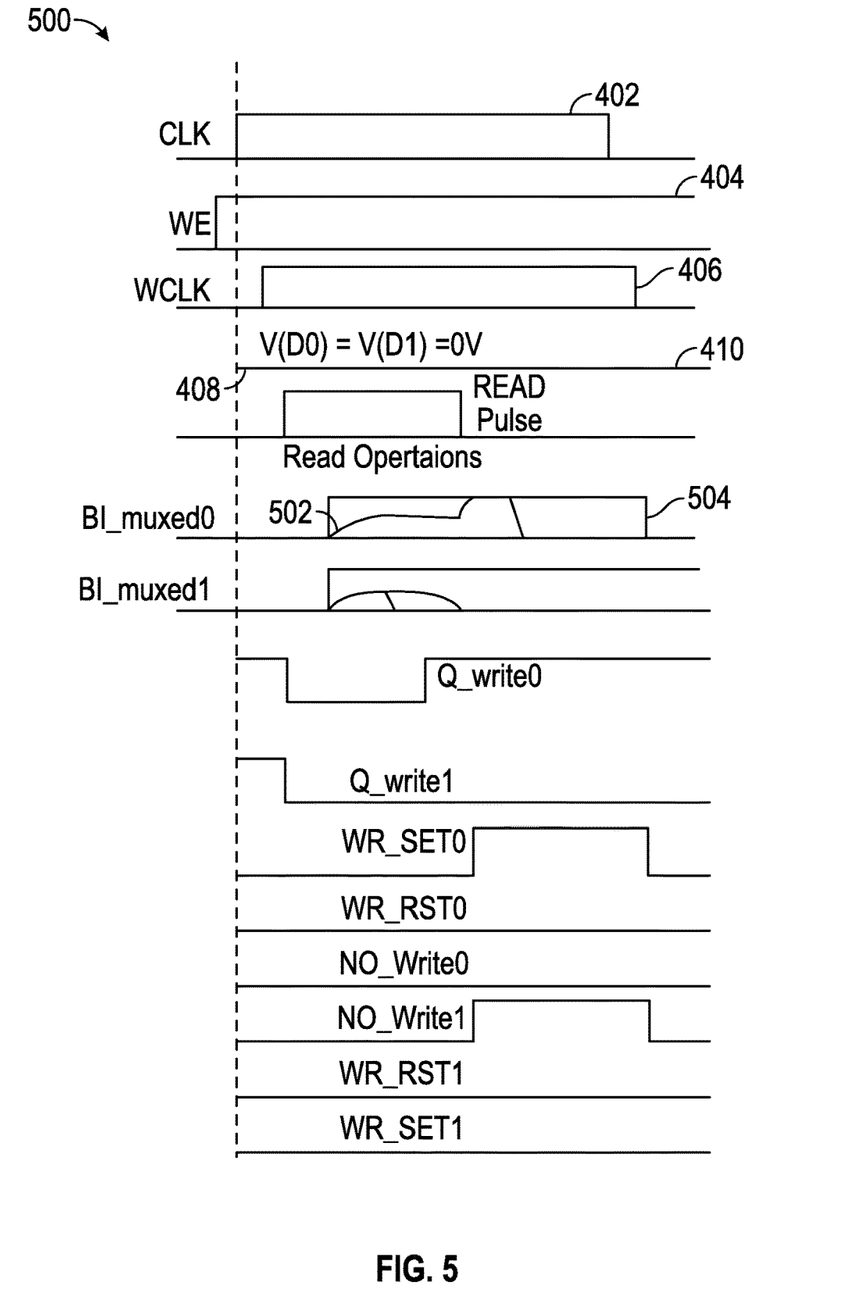
FIG. 5 is a schematic diagram of waveforms in a second write cycle according to an embodiment.

FIGS. 4 and 5 are schematic diagrams of waveforms in a first write cycle 400 (FIG. 4) and a subsequent second write cycle 500 (FIG. 5) according to an embodiment which may be applied to both columns as described in FIG. 3.

Referring to FIGS. 4 and 5, the waveforms 400, 500 comprise a clock pulse (CLK) 402 and a write enable (WE) pulse 404. When WE pulse 404 is high this indicates a program cycle and a write clock signal (WCLK) 406 is inferred by CLK and WE combined together in an AND function.

In the embodiment described in FIGS. 4 and 5, the voltage v(d0) and v(d1) are 0V 408, which are applied to input terminal 310 of FIG. 3 to receive a state d0 and d1 to be written into the bitcell 308. An internal read pulse is generated to initiate a Read operation 410.

Referring to FIG. 4, the multiplex bit line bl_muxed1 342 connected to the bitcell 308 comprises bit 1 being in a high resistive state and is unable to fully discharge 412 the multiplex bit line bl_muxed1 342. A comparison failure 414 initiates a program operation where multiplex bit line bl_muxed1 342 is pulled high to 1.2V, a SET voltage to complete the write operation.

In contrast, the multiplex bit line bl_muxed0 342 connected to the bitcell 308 comprises bit 0 being in a low resistive state and is able to fully discharge 416 the multiplex bit line bl_muxed0 342. In such an instance, a comparison match 418 indicates that no program operation is required.

The sense amplifier 302 for bit 1 senses the high resistive state and flags q_write1 high indicating a comparison failure with V(d1). In contrast the sense amplifier 302 for bit 0 senses the low resistive state and flags q_write0 low indicating a comparison match with V(d0).

Wr_set1 316 is high to indicate that a SET operation is needed on bit 1 and therefore wr_rst1 314 and wr_set1 316 are low. In contrast on bit 0 no_write0 312 is high indicating no program operation and wr_rst1 314 and wr_set 0 316 are low.

Referring to FIG. 5, the multiplex bit line bl_muxed0 342 connected to the bitcell 308 comprises bit 0 being in a high resistive state and is unable to fully discharge 502 the multiplex bit line bl_muxed0 342. A comparison failure 504 initiates a program operation where multiplex bit line bl_muxed0 342 is pulled high to 1.2V, a SET voltage to complete the write operation.

In contrast, the multiplex bit line bl_muxed1 342 connected to the bitcell 308 comprises bit 1 being in a low resistive state and is able to fully discharge the multiplex bit line bl_muxed1 342. In such an instance, a comparison match indicates that no program operation is required.

The sense amplifier 302 for bit 0 senses the high resistive state and flags q_write0 high indicating a comparison failure with V(d0). In contrast the sense amplifier 302 for bit 1 senses the low resistive state and flags q_write1 low indicating a comparison match with V(d1).

Wr_set0 316 is high to indicate that a SET operation is needed on bit 0 and therefore wr_rst1 314 and wr_set1 316 are low. In contrast on bit 1 no_write1 312 is high indicating no program operation and wr_rst1 314 and wr_set 0 316 are low.

Figure 6:
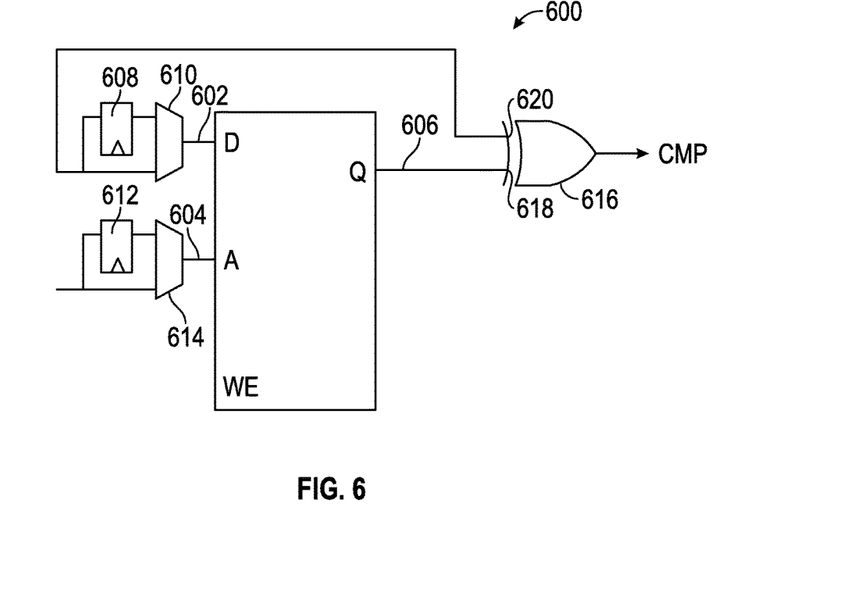
FIG. 6 is a schematic diagram of a micro-architectural circuit design supporting opportunistic writes according to an embodiment.
Figure 7:
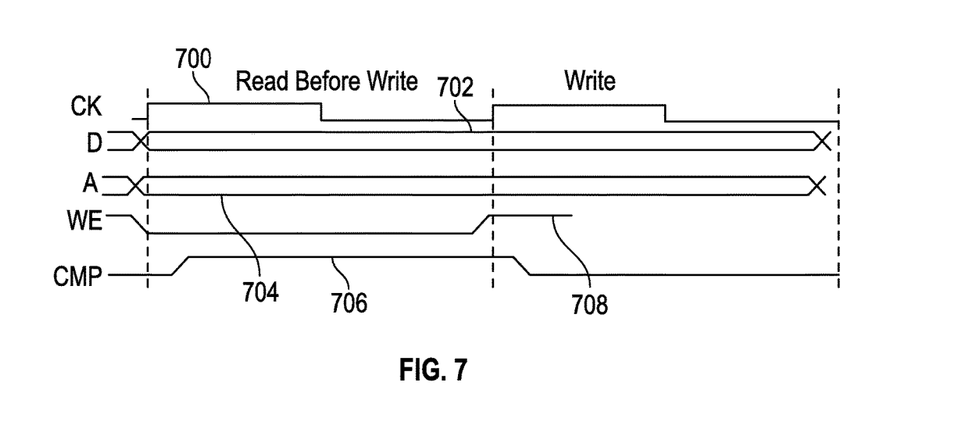
FIG. 7 is a timing diagram for operation of the circuit design according to an embodiment.

FIG. 6 is a schematic micro-architectural circuit design supporting opportunistic writes according to present techniques. Operation of techniques of FIG. 6 enables the number of write accesses to individual bit cells to be minimized leading to significant improvement in endurance. FIG. 7 is a timing diagram for operation of the circuit design according to FIG. 6. As will be understood from FIGS. 6 and 7, a read occurs in a first cycle and write in a subsequent cycle depending upon the result of a compare.

Referring to FIG. 6, the micro-architectural circuit design comprises an embedded array 600 comprising data output D at 602, address output A at 604 and data output Q at 606 being a stored state of a bitcell. First register 608 has an input connected to a first output of a first mux 610 and an output connected to a second output of the first mux 610.

The first mux 610 has an input connected to the data output D at 602. Second register 612 has an input connected to a first output of a second mux 614 and an output connected to a second output of the second mux 614. The second mux 614 has an input connected to the address output A at 604. A comparator 616 has first input 618 connected to data output Q at 606 and a second input 620 connected to the output of the first register 608 and the second output of the first mux 610.

In operation every read access to the embedded array 600 progress with a single clock CK cycle 700 and each write access proceeds in two atomic cycles. In the first cycle, a read access is performed and the data D 702 and address A 704 are latched in first and second registers 608 and 612 respectively. The read data D 702 is then compared to the input data Q to raise a comparison decision flagged by the CMP signal 706. The CMP signal initiates a write access 708 in the subsequent cycle in the event of a non-redundant write. Accordingly, in such a technique opportunistic write accesses to an embedded CERAM array has initial read access that produces read data that is compared with the input data. The comparison result then acts as a decision signal on whether or not the subsequent write cycle occurs or not.

Those skilled in the art will appreciate that while the foregoing has described what is considered to be the best mode and where appropriate other modes of performing present techniques, the present techniques should not be limited to the specific configurations and methods disclosed in this description of the preferred embodiment. Those skilled in the art will recognise that present techniques have a broad range of applications, and that the embodiments may take a wide range of modifications without departing from the any inventive concept as defined in the appended claims.

Accordingly, some features of the disclosed embodiments are set out in the following numbered items.

1. A method of writing a state to a correlated electron element in a storage circuit, the method comprising receiving a write command for writing the state into the correlated electron element; reading a stored state of the correlated electron element; comparing the state and the stored state; and enabling a write driver for writing the state into the correlated electron element when the state and read state are different.
2. A method as claimed in item 1, wherein enabling the write driver includes resetting from a high-impedance state to a low impedance state or setting from a low-impedance state to a high impedance state.
3. A method as claimed in item 1, wherein the reading of the stored state is read on a bitline coupled across a sense amplifier and the correlated electron element.
4. A method as claimed in item 3, wherein the bitline is pulled down to a reference voltage when the state and the read state are the same.
5. A method as claimed in item 3, wherein the bitline is pulled up to a reference voltage when the state and read state are different.
6. A method as claimed in item 1, wherein reading occurs in a read-pulse where write is inactive.
7. A method as claimed in item 1, wherein writing occurs in a write-pulse where reading is not active.
8. A method as claimed in item 6, wherein the read and write pulses are done in separate clock cycles.
9. A method as claimed in item 6, wherein the read and write pulses are done in a single clock cycle.
10. A method as claimed in item 8, wherein the clock is a timing pulse to make a pulsed read.
11. A method as claimed in item 9, wherein the clock is a timing pulse to make a pulsed read.
12. A method as claimed in item 1, including in the event of the stored state and read state being matching states, not writing the state to be written into the correlated electron element.
13. A method as claimed in item 12, wherein the not writing the state to be written into the correlated electron element occurs in a second clock cycle, following a first clock cycle comprising reading the stored state.
14. A method as claimed in item 1, wherein the state of the correlated electron element is controllable by the write driver to be in one of a high impedance state and a low impedance state.
15. A storage circuit comprising an array of correlated electron elements provided with first signal lines coupled to each correlated electron element and a sensor circuit capable of sensing a state of a correlated electron element; a comparator circuit coupled to the sensor circuit for receiving the sensed state and for receiving a state to be written into a correlated electron element; wherein the comparator circuit comprises first output terminals coupled to a logic circuit having second output terminals coupled to the first signal line.
16. A storage circuit as claimed in item 15, wherein the first signal line is a multiplexed bit line.
17. A storage circuit as claimed in item 15, wherein the comparator is capable of outputting a data signal indicative of when the sensed state and received state are the same and when the sensed state and received state are different.
18. A storage circuit as claimed in item 15, wherein the comparator circuit is capable of outputting a voltage for setting a state of the correlated electron element from a low impedance state to a high impedance state and resetting a state from a high impedance state to a low impedance state.
19. A hard disk comprising a storage circuit a claimed in item 15.
20. A method of saving data to a hard disk as claimed in item 1.

The invention claimed is:

1. A method of writing a state to a correlated electron element in a storage circuit, the method comprising receiving a write command for writing the state into the correlated electron element; reading a stored state of the correlated electron element; comparing the state and the stored state; and enabling a write driver for writing the state into the correlated electron element when the state and read state are different wherein the reading of the stored state is read on a bitline coupled across a sense amplifier and the correlated electron element.

2. A method as claimed in claim 1, wherein enabling the write driver includes resetting from a high-impedance state to a low impedance state or setting from a low-impedance state to a high impedance state.

3. A method as claimed in claim 1, wherein the bitline is pulled down to a reference voltage when the state and the read state are the same.

4. A method as claimed in claim 1, wherein the bitline is pulled up to a reference voltage when the state and read state are different.

5. A method as claimed in claim 1, wherein reading occurs in a read-pulse where write is inactive.

6. A method as claimed in claim 1, wherein writing occurs in a write-pulse where reading is not active.

7. A method as claimed in claim 6, wherein the read and write pulses are done in separate clock cycles.

8. A method as claimed in claim 6, wherein the read and write pulses are done in a single clock cycle.

9. A method as claimed in claim 8, wherein the clock is a timing pulse to make a pulsed read.

10. A method as claimed in claim 9, wherein the clock is a timing pulse to make a pulsed read.

11. A method as claimed in claim 1, including in the event of the stored state and read state being matching states, not writing the state to be written into the correlated electron element.

12. A method as claimed in claim 11, wherein the not writing the state to be written into the correlated electron element occurs in a second clock cycle, following a first clock cycle comprising reading the stored state.

13. A method as claimed in claim 1, wherein the state of the correlated electron element is controllable by the write driver to be in one of a high impedance state and a low impedance state.

14. A method of saving data to a hard disk as claimed in claim 1.

\* \* \* \* \*